(12) United States Patent
Mohammed et al.

(10) Patent No.: US 8,884,425 B1
(45) Date of Patent: Nov. 11, 2014

(54) THERMAL MANAGEMENT IN 2.5 D SEMICONDUCTOR PACKAGING

(71) Applicant: FutureWei Technologies, Inc., Plano, TX (US)

(72) Inventors: Anwar A. Mohammed, San Jose, CA (US); Vadim Gektin, San Jose, CA (US)

(73) Assignee: FutureWei Technologies, Inc., Plano ( * ) Notice: Subject to any disclaimer, the term of this patent is extended or adjusted under 35 U.S.C. 154(b) by 0 days.

(21) Appl. No.: 13/891,251

(22) Filed: May 10, 2013

(51) Int. Cl.
*H01L 23/10* (2006.01)
*H01L 25/00* (2006.01)
*H01L 23/34* (2006.01)

(52) U.S. Cl.
CPC ............... *H01L 23/34* (2013.01); *H01L 25/00* (2013.01); *H01L 25/50* (2013.01)
USPC .................................. 257/706; 257/E23.105

(58) Field of Classification Search
CPC .................. H01L 23/427; H01L 23/34–23/36; H01L 23/373; H01L 23/3736
USPC ........... 257/706, 707, 713, E23.105; 438/122
See application file for complete search history.

(56) References Cited

U.S. PATENT DOCUMENTS

| 6,611,057 B2 * | 8/2003 | Mikubo et al. ................. 257/714 |
| 8,415,788 B2 * | 4/2013 | Li et al. ............................ 257/723 |
| 2012/0300392 A1 * | 11/2012 | Johnson et al. ........... 361/679.47 |

* cited by examiner

*Primary Examiner* — Quoc Hoang
(74) *Attorney, Agent, or Firm* — Slater & Matsil, L.L.P.

(57) ABSTRACT

Lower semiconductor dies in 2.5 D semiconductor packaging configurations can be cooled by thermally coupling the lower semiconductor dies to a heat sink positioned above the interposer, to an upper semiconductor die, to a heat sink affixed beneath a substrate, or to free-flowing air circulating above the interposer or beneath the substrate. The thermal coupling can be achieved using heat pipes, thermal vias, or other conductive passage ways.

21 Claims, 7 Drawing Sheets

THERMAL MANAGEMENT IN 2.5 D SEMICONDUCTOR PACKAGING

TECHNICAL FIELD

The present invention relates generally to semiconductor technology, and in some embodiments, to an apparatus and method for thermal management in 2.5 D semiconductor packaging.

BACKGROUND 2.5 D packaging and interconnect technology is a promising semiconductor packaging technology that provides costs and reliability savings over 3D packaging technology. 2.5 D packaging technology is a fast growing packaging technology which allows the integration of homogenous and non-homogenous chips on an interposer for enhanced performance and miniaturization. In some implementations, 2.5 D semiconductor packaging mounts one or more semiconductor dies on the undercarriage of the interposer, thereby positioning those semiconductor dies in a relatively tight cavity between the interposer and substrate. While this achieves a more compact semiconductor package configuration, it also raises challenges related to thermal management, as it may be quite difficult to control the operating temperature of semiconductor dies mounted beneath the interposer due to space and/or airflow limitations. Accordingly, mechanisms for controlling the operating temperature of chips mounted beneath an interposer in a 2.5 D packaging configuration are desired.

SUMMARY OF THE INVENTION

Technical advantages are generally achieved, by embodiments of this disclosure which describe an apparatus and method for thermal management in 2.5 D semiconductor packaging.

In accordance with an embodiment, a semiconductor package is provided. In this example, the semiconductor package includes an interposer, an upper semiconductor die affixed to the interposer, and a lower semiconductor die affixed to the interposer. The interposer is positioned in-between the upper semiconductor die and the lower semiconductor die. The semi-conductor package further includes a heat sink affixed to the upper semiconductor die, and a heat pipe thermally coupling the lower semiconductor die to the heat sink.

In accordance with another embodiment, another semiconductor package is provided. In this example, the semiconductor package includes a substrate comprising one or more thermal vias, an interposer positioned above the substrate, and a lower semiconductor die affixed to the interposer. The one or more thermal vias extend through the substrate, and the lower semiconductor die is positioned in-between the substrate and the interposer. The semiconductor package further includes a heat plug affixably interposed between the lower semiconductor die and the substrate, wherein the heat plug thermally couples the lower semiconductor die to the one or more thermal vias extending through the substrate.

In accordance with yet another embodiment, a method for constructing a semiconductor package is provided. In this example, the method includes affixing a lower semiconductor die to a lower face of an interposer, affixing an upper semiconductor die to an upper face of the interposer, and affixing the interposer to an upper face of a substrate. The lower semiconductor die is positioned in-between the interposer and the substrate. In one embodiment, the method further includes thermally coupling the lower semiconductor die to a heat sink positioned above the upper semiconductor die. In another embodiment, the method further includes thermally coupling the lower semiconductor die to one or more thermal vias extending through the substrate.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

As discussed above, space and airflow limitations make it quite difficult to control the operating temperature of semiconductor chips mounted to the lower face of an interposer in a 2.5 D semiconductor package. For purposes of clarity and concision, this disclosure will refer to semiconductor dies mounted to the lower face of an interposer in a 2.5 D semiconductor package (e.g., in the cavity between the interposer and the substrate) as lower semiconductor dies, while referring to semiconductor chips mounted to the upper face of the interposer as upper semiconductor dies. For example, the cavity between the interposer and substrate may be too small to house a heat sink of adequate size to sufficiently dissipate heat from the lower semiconductor die. Further, the cavity may be incapable of channeling a sufficient amount of free-flowing air over the lower semiconductor die (or a heat sink affixed thereto) to maintain the die's temperature within an operable range. Accordingly, mechanisms for controlling the operating temperature of lower semiconductor dies are desired.

Aspects of this disclosure provide thermal management techniques for controlling the operating temperature of lower semiconductor dies in 2.5 D semiconductor packaging configurations. One thermal management technique includes thermally coupling the lower semiconductor die to the upper semiconductor die (or to a heat sink affixed thereto) via a heat pipe. The heat pipe may be composed of any thermally conductive material (e.g., copper (Cu), high k graphite, etc.), and may be routed around the interposer. Another thermal management technique includes thermally coupling the lower semiconductor die to thermal vias extending through the substrate via a heat plug. The thermal vias may dissipate heat directly into free-flowing air that circulates beneath the substrate, or alternatively, to a heat sink positioned beneath the substrate. These techniques may be modified depending on design or functional considerations. By way of example, the heat pipe may be thermally coupled to a heat sink positioned below the substrate or in any location outside the cavity formed between the interposer and the substrate. As another example, the heat pipe may dissipate heat into free-flowing air.

Figure 1:
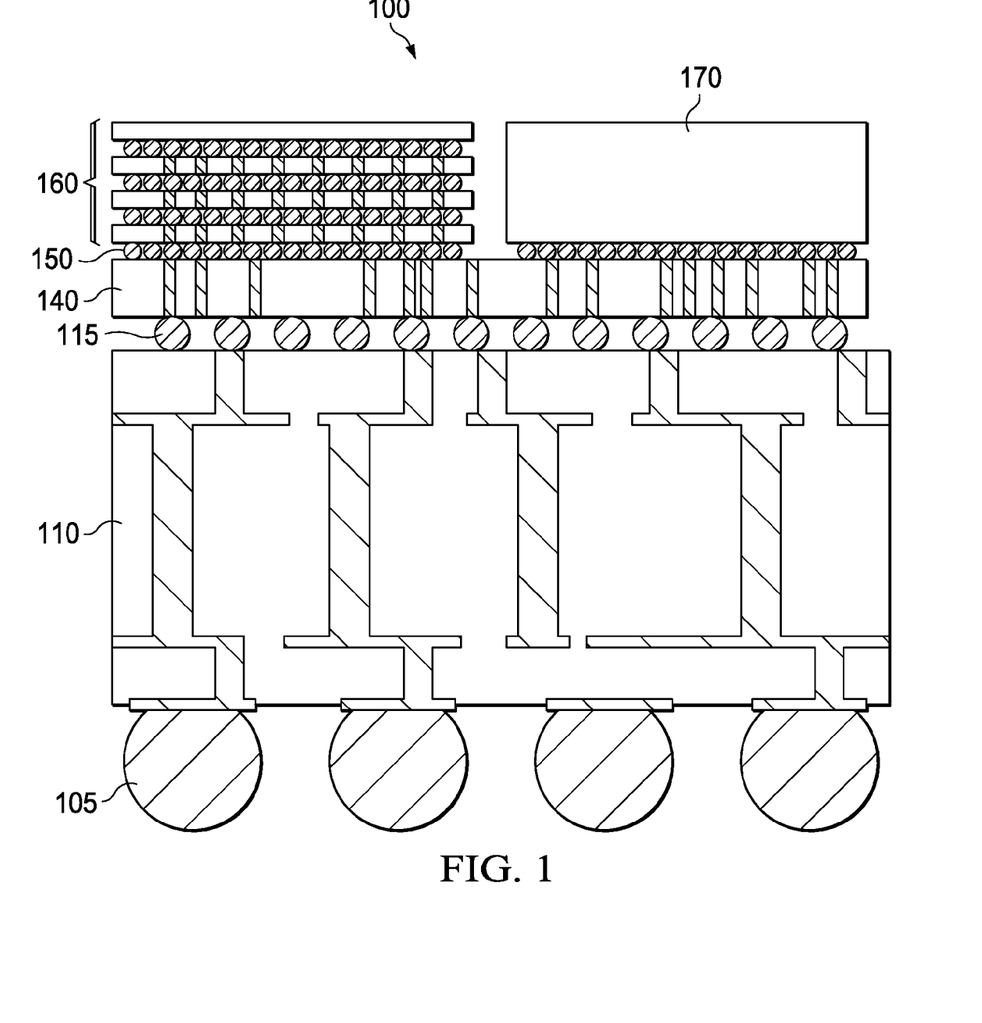
FIG. 1 illustrates a diagram of a 2.5 D semiconductor package.

FIG. 1 illustrates a 2.5 D semiconductor package 100 comprising a substrate 110, an interposer 140, and semiconductor dies 160-170. The substrate 110 may be composed of organic or inorganic material, and may serve as the foundation upon which the semiconductor device is built. The interposer 140 may comprise organic or inorganic material, and may serve as an interface between the semiconductor dies 160-170 and the substrate 110. The semiconductor dies 160-170 may be composed of semiconducting material upon which functional integrated circuits are fabricated. The substrate 110 may be conductively coupled to a printed circuit board (PCB) (not shown) via one or more solder balls 105, while the interposer 140 may be conductively coupled to the substrate 110 via one or more controlled collapse chip connection (C4) bumps 115. Likewise, the semiconductor dies 160-170 may be conductively coupled to the interposer 140 via micro-bumps 150. The respective sizes of the solder balls 105, C4 bumps 115, and micro-bumps 150 may vary depending on design and/or functional features of the 2.5 D semiconductor package 100. Notably, the 2.5 D semiconductor package 100 is distinguished from other semiconductor packaging designs (e.g., 3D or otherwise) due to its inclusion of two or more laterally adjacent semiconductor dies 160-170. By way of comparison, a 3D semiconductor packaging configuration would stack two or more chips in a single vertical column.

Figure 2:
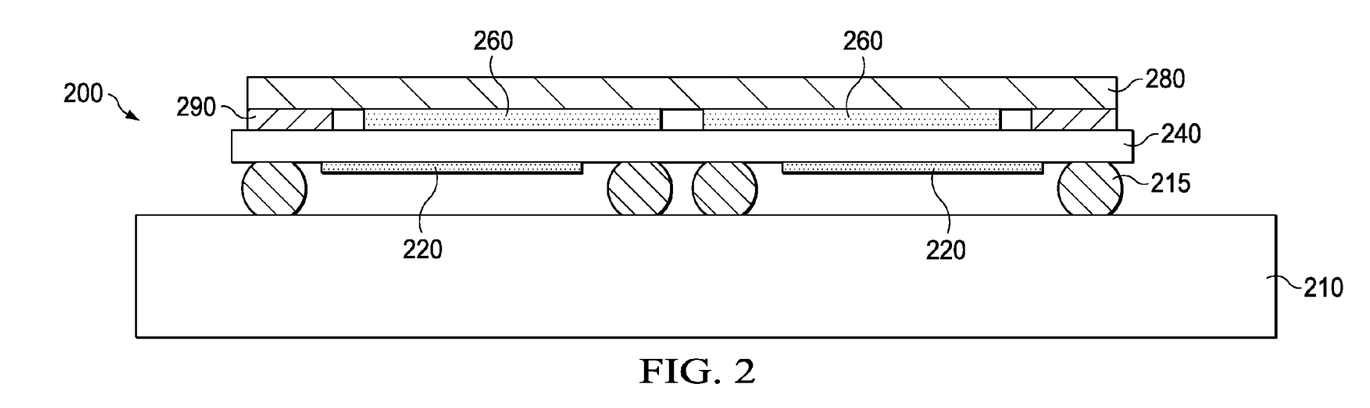
FIG. 2 illustrates another diagram of a 2.5 D semiconductor package.

In some implementations, 2.5 D semiconductor packaging may position semiconductor dies on the undercarriage of the interposer. FIG. 2 illustrates a 2.5 D semiconductor package 200 comprising a substrate 210, a plurality of C4 bumps 215, a plurality of lower semiconductor dies 220, an interposer 240, a plurality of upper semiconductor dies 260, a heat sink 280, and one or more standoffs 290. In an embodiment, the substrate 210, the C4 bumps 215, the interposer 240, and the lower semiconductor dies 220, and the upper semiconductor dies 260 are configured in a similar fashion to like components of the 2.5 D semiconductor package 100. The heat sink 280 may be thermally coupled to the upper semiconductor dies 260, and may provide thermal management by dissipating heat from the upper semiconductor dies 260 into free-flowing air. The standoffs 290 may provide structural support to prevent the heat sink 280 from damaging or otherwise exerting too much force on the upper semiconductor dies 260.

As shown, the cavity between the lower semiconductor dies 220 and the substrate 210 is relatively compact, and may have space and/or airflow limitations that make it difficult to control the operating temperature of lower semiconductor dies 220 within an acceptable range. For example, the cavity may be too small to house a heat sink of adequate size, or may otherwise be incapable of channeling a sufficient amount of free-flowing air to maintain the semiconductor die's 220 operating temperature within an acceptable range. Thermal management may be particularly difficult for high output dies, such as those dissipating more than 100 watts.

Figure 3:
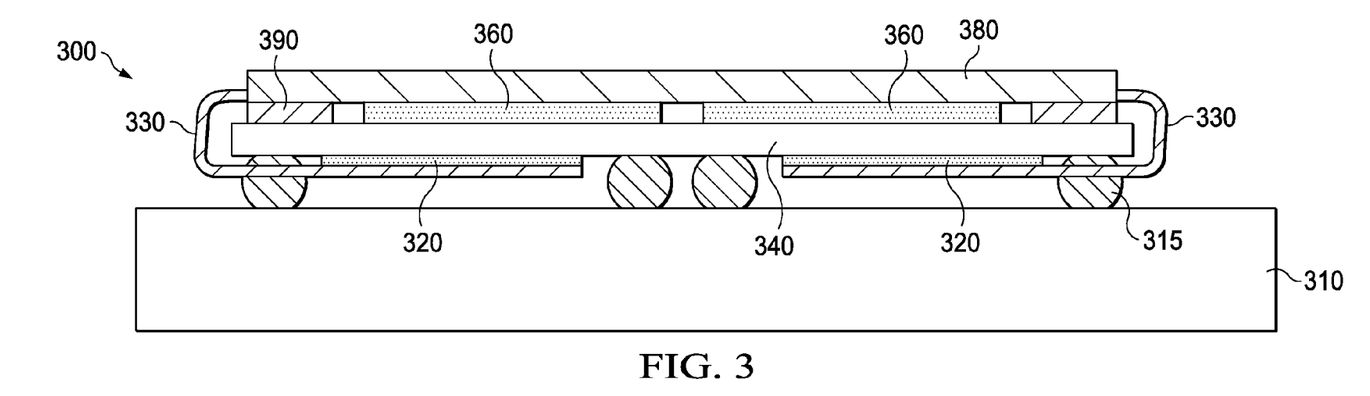
FIG. 3 illustrates a diagram of an embodiment 2.5 D semiconductor package.

Embodiments of this disclosure deploy heat pipes to dissipate heat from lower semiconductor dies to a heat sink positioned above the interposer. FIG. 3 illustrates a 2.5 D semiconductor package 300 comprising a substrate 310, a plurality of C4 bumps 315, a plurality of lower semiconductor dies 320, a plurality of heat pipes 330, an interposer 340, a plurality of upper semiconductor dies 360, a heat sink 380, and one or more standoffs 390. The components 310-320 and 360-390 are configured similarly to like components in the 2.5 D semiconductor package 200. The heat pipes 330 are configured to dissipate heat from the lower semiconductor dies 320 to the heat sink 380 positioned above the interposer 340. More specifically, the heat pipes 330 are composed of thermally conductive material (e.g., aluminum, high k graphite, etc.), and serve to thermally couple the lower semiconductor dies 320 to the heat sink 380. This may allow thermal energy to flow from the semiconductor dies 320 to the heat sink 380, which may have sufficient means (e.g., surface area, etc.) to dissipate the heat into free flowing air.

Figure 4:
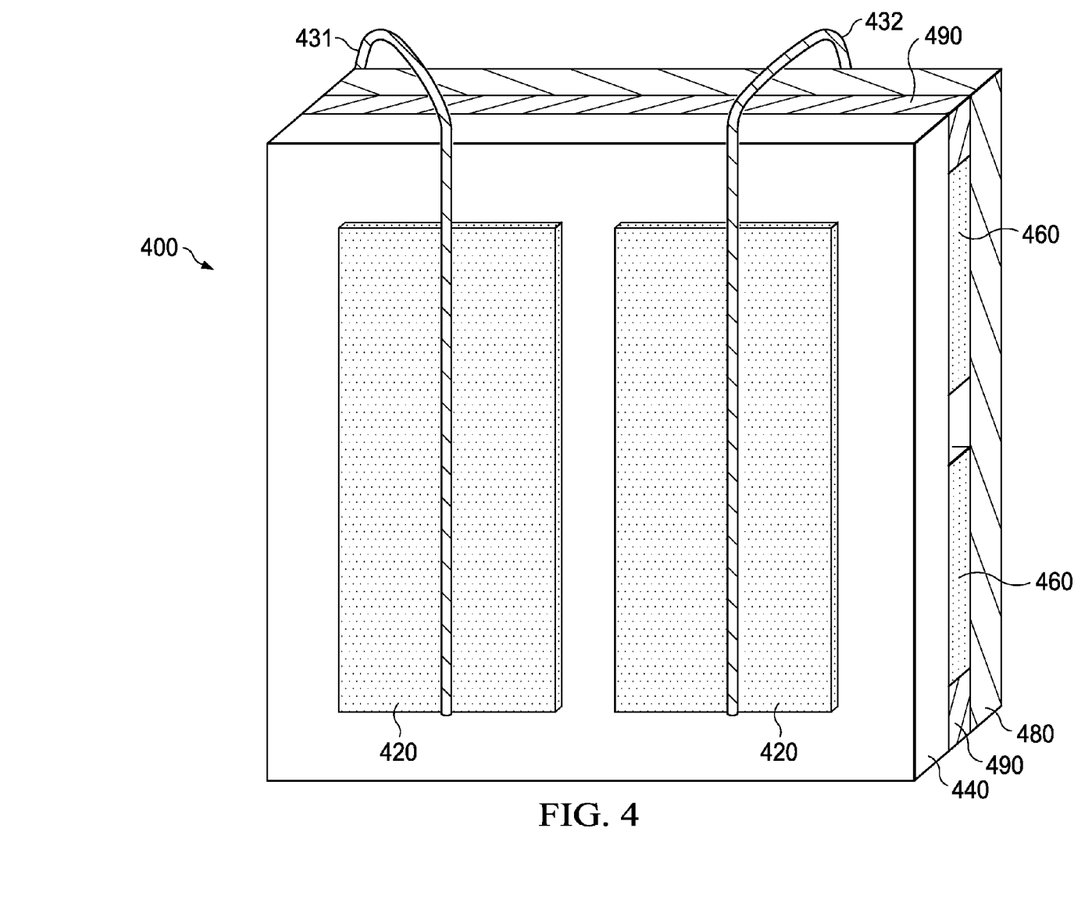
FIG. 4 illustrates a diagram of an interposer undercarriage in a 2.5 D semiconductor packaging configuration.

FIG. 4 illustrates an interposer undercarriage in a 2.5 D semiconductor packaging configuration 400. As shown, the 2.5 D semiconductor packaging configuration 400 includes lower semiconductor dies 420, heat pipes 431-432, an interposer 440, upper semiconductor dies 460, a heat sink 480, and standoffs 490. The components 420-490 are configured similarly to like components in the 2.5 D semiconductor package 300. As shown, the heat pipes 431-432 thermally couple the lower semiconductor dies 420 to the heat sink 480. In different embodiments, the heat pipes 431-432 may extend to the same or different portions of the heat sink 480 to achieve more efficient thermal dissipation and/or to accommodate functional/aesthetic considerations. By way of example, the heat pipe 431 may extend to the corner of the heat sink 480 (which may be the coolest point on the heat sink 480) to increase efficient dissipation efficiency. As another example, the heat pipe 432 may extend to a middle portion of the heat sink to achieve a more compact configuration, a shorter heat pipe length, or to accommodate some other functional/aesthetic consideration.

Figure 5:
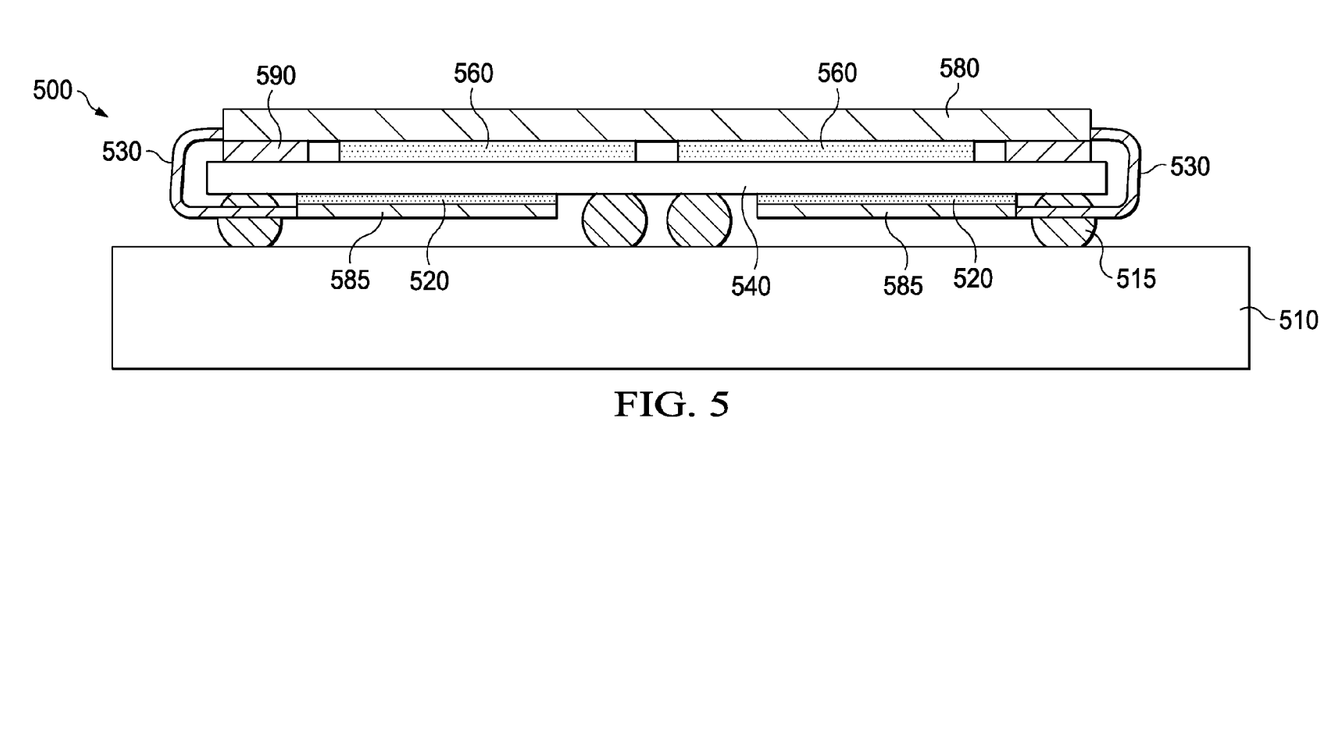
FIG. 5 illustrates a diagram of another embodiment 2.5 D semiconductor package.

In some embodiments, an intermediate heat sink may be placed on the lower semiconductor dies to achieve a more efficient transfer of heat to the heat pipes. FIG. 5 illustrates a 2.5 D semiconductor package 500 comprising a substrate 510, C4 bumps 515, lower semiconductor dies 520, heat pipes 530, an interposer 540, upper semiconductor dies 560, a heat sink 580, intermediate heat sinks 585, and standoffs 590. The components 510-580 and 590 are configured similarly to like components in the 2.5 D semiconductor package 300. The intermediate heat sinks 585 are configured to transfer heat from the lower semiconductor dies 520 to the heat pipes 530. In embodiments, the intermediate heat sinks 585 may dissipate some heat into free-flowing air circulating in the cavity between the interposer 540 and the substrate 510. However, the heat pipes 530 may allow for more efficient heat transfer, particularly when the amount of free-flowing air circulating in the cavity between the interposer 540 and the substrate 510 is insufficient to maintain the lower semiconductor dies 520 at operable temperatures.

Figure 6:
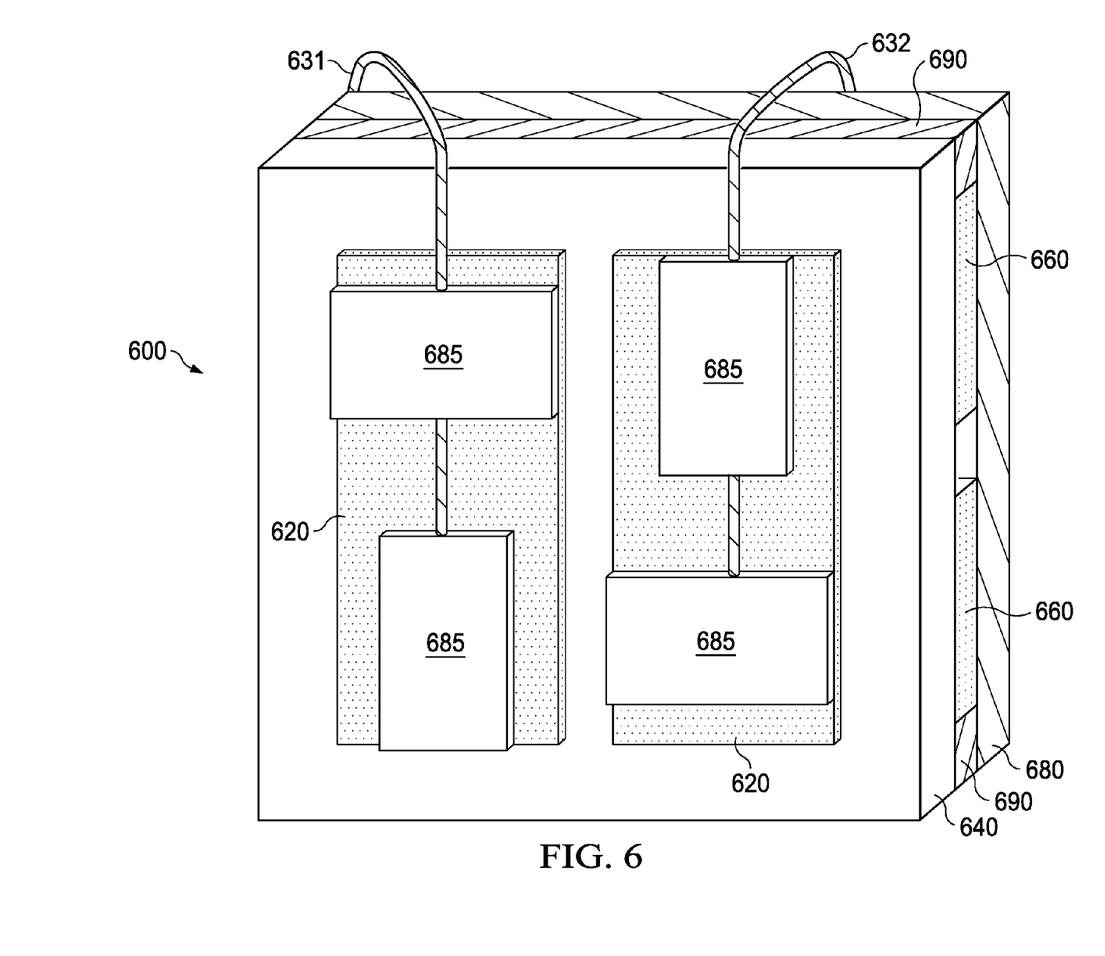
FIG. 6 illustrates a diagram of another interposer undercarriage in a 2.5 D semiconductor packaging configuration.

FIG. 6 illustrates an interposer undercarriage in a 2.5 D semiconductor packaging configuration 600. As shown, the 2.5 D semiconductor packaging configuration 600 includes lower semiconductor dies 620, heat pipes 631-632, an interposer 640, upper semiconductor dies 660, a heat sink 680, and standoffs 690. The components 620-690 are configured similarly to like components in the 2.5 D semiconductor package 500. As shown, the heat pipes 631-632 thermally couple the lower semiconductor dies 620 to the heat sink 680. The heat pipes 631-632 may extend to the same or different portions of the heat sink 680 to achieve more efficient heat transfer and/or to accommodate functional/aesthetic considerations.

Although FIGS. 3-6 depict heat sinks positioned above the interposer, the heat pipes may be modified to extend to heat sinks positioned in other locations, e.g., below the substrate, etc. Alternatively, the heat pipes may be modified to thermally couple the lower semiconductor dies to the upper semiconductor dies or to free-flowing air circulating above the interposer or below the substrate.

Figure 7:
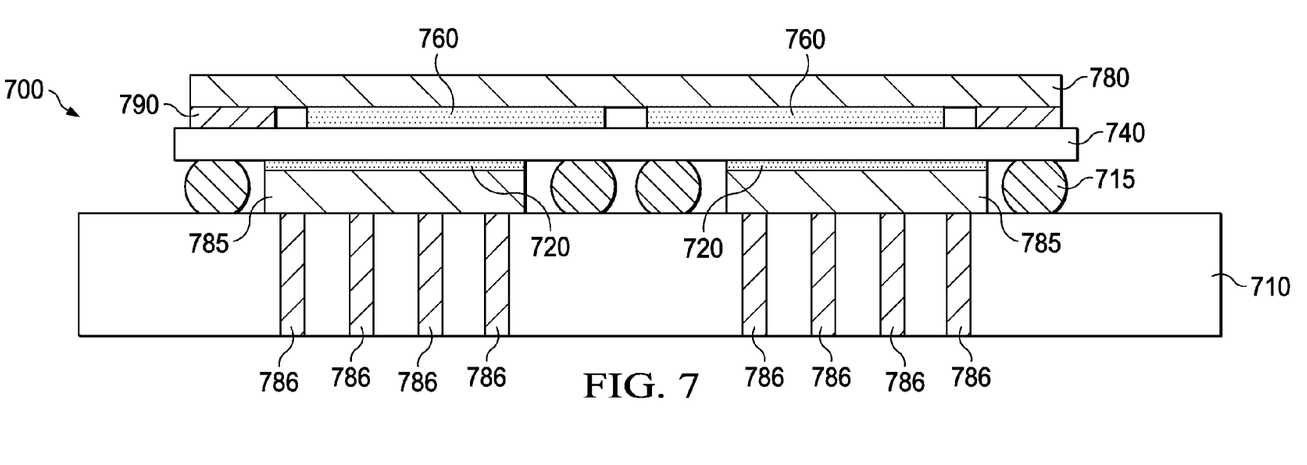
FIG. 7 illustrates a diagram of yet another embodiment 2.5 D semiconductor package.

Other aspects of this disclosure use thermal vias and/or heat plugs to dissipate heat from lower semiconductor dies to free-flowing air circulating below the substrate. FIG. 7 illustrates a 2.5 D semiconductor package 700 comprising a substrate 710, C4 bumps 715, lower semiconductor dies 720, an interposer 740, upper semiconductor dies 760, a heat sink 780, heat plugs 785, thermal vias 786, and standoffs 790. The components 710-780 and 790 may be configured similarly to like components of the 2.5 D semiconductor package 500. The heat plugs 785 and the thermal vias 786 may be composed of thermally conductive material, and may be configured to collectively dissipate heat from the lower semiconductor dies 720 to free-flowing air circulating below the substrate 710.

Figure 8:
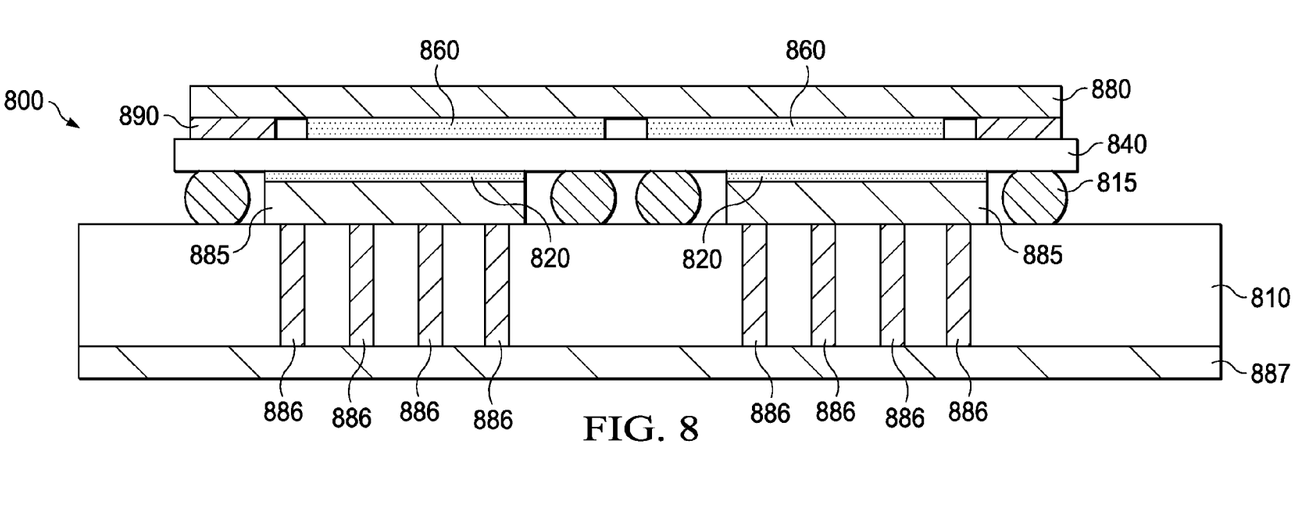
FIG. 8 illustrates a diagram of yet another embodiment 2.5 D semiconductor package.

In some embodiments, the thermal vias may be thermally coupled to a heat sink positioned below the substrate in order to improve heat transfer efficiency to the free-flowing air. FIG. 8 illustrates a 2.5 D semiconductor package 800 comprising a substrate 810, C4 bumps 815, lower semiconductor dies 820, an interposer 840, upper semiconductor dies 860, a heat sink 880, heat plugs 885, thermal vias 886, a lower heat sink 887, and standoffs 890. The components 810-886 and 890 may be configured similarly to like components of the 2.5 D semiconductor package 800. As shown, the thermal vias 886 extend to the lower heat sink 887, which may improve heat transfer efficiency from the lower semiconductor dies 820 to free-flowing air circulating below the substrate 810.

Figure 9:
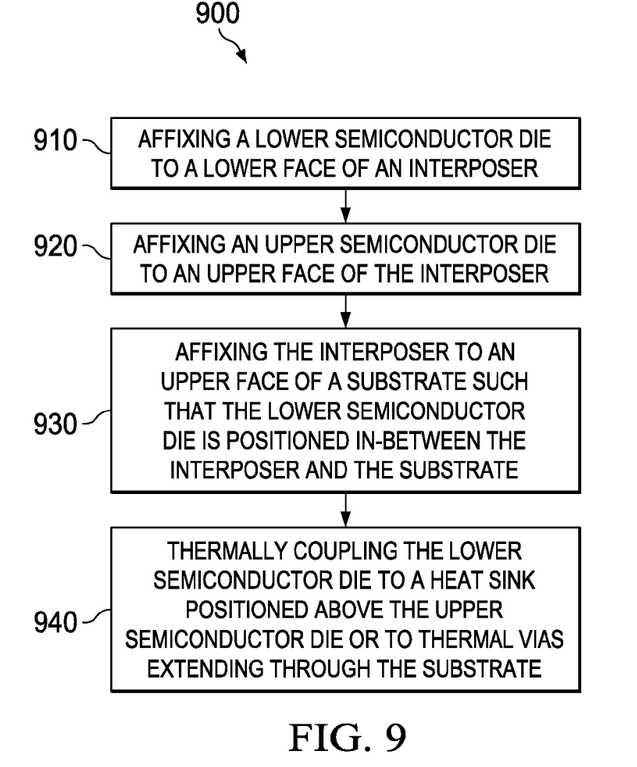
FIG. 9 illustrates a flow chart of an embodiment method for manufacturing a 2.5 D semiconductor package.

FIG. 9 illustrates a method 900 for manufacturing a 2.5 D semiconductor package in accordance with aspects of this disclosure, as might be performed by a manufacturing device in a factory setting. As shown, the method 900 begins with step 910, where the manufacturing device affixes a lower semiconductor die to a lower face of an interposer. Thereafter, the method 900 proceeds to step 920, where the manufacturing device affixes an upper semiconductor die to an upper face of the interposer. Next, the method 900 proceeds to step 930, where the manufacturing device affixes the interposer to an upper face of the substrate such that the lower semiconductor die is positioned in-between the interposer and the substrate. Subsequently, the method 900 proceeds to step 940, where the manufacturing device thermally couples the lower semiconductor die to a heat sink positioned above the upper semiconductor die. Alternatively, in the step 940, the manufacturing device thermally couples the lower semiconductor die to thermal vias extending through the substrate. The thermal vias may extend to free-flowing air circulating below the substrate or to a heat sink positioned below the substrate.

2.5 D packaging technology is a fast growing packaging technology which allows the integration of homogenous and non-homogenous chips on an interposer for enhanced performance and miniaturization. Aspects of this disclosure may provide the following benefits: powerful enabler for the highly popular 2.5 D and 3 D packaging technology; effective thermal management for higher power dissipation; associated 2.5 D advantages of Application-Specific Integrated Circuits (ASICs) and memory integration.

Figure 10:
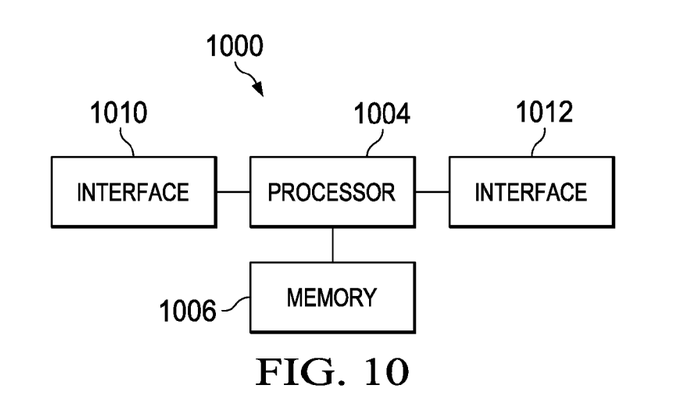
FIG. 10 illustrates a block diagram of an embodiment manufacturing device.

FIG. 10 illustrates a block diagram of an embodiment manufacturing device 1000, which may be used to perform one or more aspects of this disclosure. The manufacturing device 1000 includes a processor 1004, a memory 1006, and a plurality of interfaces 1010-1012, which may (or may not) be arranged as shown in FIG. 10. The processor 1004 may be any component capable of performing computations and/or other processing related tasks, and the memory 1006 may be any component capable of storing programming and/or instructions for the processor 1004. The interface 1010-1012 may be any component or collection of components that allows the device 1000 to communicate control instructions to other devices, as may be common in a factory setting.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A semiconductor package comprising:
an interposer having:
an undercarriage face couplable to a substrate, and
an upper face;
an upper semiconductor die affixed to the upper face of the interposer;
a lower semiconductor die affixed to the undercarriage face of the interposer, wherein the interposer is positioned between the upper semiconductor die and the lower semiconductor die, and wherein the lower semiconductor die, when the undercarriage face is coupled to the substrate, is positioned between the interposer and the substrate;
a heat sink affixed to the upper semiconductor die; and
a heat pipe thermally coupling the lower semiconductor die to the heat sink.

2. The semiconductor package of claim 1, wherein the heat pipe is configured to dissipate heat from the lower semiconductor die to the heat sink.

3. The semiconductor package of claim 1, wherein the heat pipe extends from the lower semiconductor die to the heat sink, the heat pipe being routed around the interposer.

4. The semiconductor package of claim 1, wherein the heat pipe extends from the lower semiconductor die to the heat sink, the heat pipe extending through the interposer.

5. The semiconductor package of claim 1, wherein the heat pipe is affixed to a corner of the heat sink.

6. The semiconductor package of claim 1, wherein the heat pipe is affixed directly to the lower semiconductor die.

7. The semiconductor package of claim 1, further comprising:
an intermediate heat sink affixed to the lower semiconductor die and the heat sink, wherein the heat pipe is configured to draw heat from the lower semiconductor die through the intermediate heat sink.

8. The semiconductor package of claim 1, wherein the semiconductor package is configured in accordance with a 2.5 D semiconductor packaging technique.

9. The semiconductor package of claim 1, wherein the heat pipe comprises graphite.

10. The semiconductor package of claim 1, wherein the heat pipe comprises copper.

11. A semiconductor package comprising:
an interposer having an undercarriage face couplable to a substrate;
a lower semiconductor die affixed to the undercarriage face of the interposer, wherein the lower semiconductor die would be positioned between the interposer and the substrate when the interposer is coupled to the substrate; and
a heat pipe thermally coupling the lower semiconductor die to a heat sink.

12. The semiconductor package of claim 11, wherein the heat pipe is configured to dissipate heat from the lower semiconductor die to the heat sink.

13. The semiconductor package of claim 11, wherein the heat pipe extends from the lower semiconductor die to the heat sink, the heat pipe being routed around the interposer.

14. The semiconductor package of claim 11 further comprising an upper semiconductor die affixed to and positioned between the heat sink and the interposer.

15. The semiconductor package of claim 11, wherein the heat pipe extends from the lower semiconductor die to the heat sink, the heat pipe extending through the interposer.

16. The semiconductor package of claim 11, wherein the heat pipe is affixed to a corner of the heat sink.

17. The semiconductor package of claim 11, wherein the heat pipe is affixed directly to the lower semiconductor die.

18. The semiconductor package of claim 11, further comprising:
an intermediate heat sink affixed to the lower semiconductor die and the heat sink, wherein the heat pipe is configured to draw heat from the lower semiconductor die through the intermediate heat sink.

19. The semiconductor package of claim 11, wherein the semiconductor package is configured in accordance with a 2.5 D semiconductor packaging technique.

20. The semiconductor package of claim 11, wherein the heat pipe comprises graphite.

21. The semiconductor package of claim 11, wherein the heat pipe comprises copper.

* * * * *